United States Patent
Sheppard

(10) Patent No.: US 8,164,503 B2
(45) Date of Patent: Apr. 24, 2012

(54) DATA CONVERTER SYSTEM THAT AVOIDS INTERLEAVE IMAGES AND DISTORTION PRODUCTS

(75) Inventor: Roger D. Sheppard, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 12/637,262

(22) Filed: Dec. 14, 2009

(65) Prior Publication Data

US 2011/0140946 A1  Jun. 16, 2011

(51) Int. Cl.
  *H03M 1/12* (2006.01)
(52) U.S. Cl. ........................ 341/155; 341/122
(58) Field of Classification Search .................. 341/155, 341/144, 143, 118, 120
  See application file for complete search history.

(56) References Cited

U.S. PATENT DOCUMENTS

| | | | |
|---|---|---|---|
| 6,177,893 B1 * | 1/2001 | Velazquez et al. ............ | 341/118 |
| 6,507,624 B1 * | 1/2003 | Jachim et al. ................ | 375/316 |
| 6,701,297 B2 * | 3/2004 | Main ............................ | 704/500 |
| 6,744,832 B2 * | 6/2004 | Miao ............................ | 375/349 |
| 7,196,650 B1 * | 3/2007 | Hand et al. ................... | 341/155 |
| 7,427,907 B2 * | 9/2008 | Sheng et al. .................. | 334/15 |
| 7,483,498 B2 * | 1/2009 | Lillington et al. ............ | 375/344 |

* cited by examiner

*Primary Examiner* — Peguy Jean Pierre
(74) *Attorney, Agent, or Firm* — Michael A. Nelson

(57) ABSTRACT

A data converter system provides an output signal having reduced spurious tones by confining an input signal to a specified frequency band and over-sampling so that the converted input signal "straddles" or "avoids" spurious tones. The spurious tones may then be filtered away, providing an output signal having a much cleaner spurious free dynamic range than a conventional data converter. For example, in one embodiment, an interleaved data converter system converts an input signal that is confined to the second Nyquist zone of one of the interleaved data converters into an interleaved signal, and then filters the interleaved signal with a filter having a pass-band that transmits the converted input frequencies and a stop-band that attenuates the spurious tones. The resulting output signal has a bandwidth that is the same as could be achieved using a single data converter, but is not impaired by interleave images or certain distortion products.

5 Claims, 4 Drawing Sheets

DATA CONVERTER SYSTEM THAT AVOIDS INTERLEAVE IMAGES AND DISTORTION PRODUCTS

FIELD OF THE INVENTION

The present invention relates to data converters, and more particularly to a data converter system that avoids interleave images and distortion products.

BACKGROUND OF THE INVENTION

Data converters such as analog-to-digital converters (ADCs), digital-to-analog converters (DACs), and track-and-holds (T/Hs) can be used in two different ways. The first way is as a "baseband data converter" in which the data converter samples at a sample rate ("Fs") that is at least twice as high as the highest frequency contained in an input signal. In order to prevent aliasing, the input frequencies must be restricted to the frequency range spanning DC to Fs/2, or in other words, the input frequencies must be "confined" to the first "Nyquist zone," where the first Nyquist zone is the frequency range spanning DC to Fs/2, the second Nyquist zone is the frequency range spanning Fs/2 to Fs, the third Nyquist zone is the frequency range spanning Fs to 3Fs/2, and so on. The second way that a data converter may be used is as a "band-pass data converter" in which input frequencies are confined to one of the higher Nyquist zones. Although the input frequencies are technically aliased, a band-pass data converter can provide high fidelity from any Nyquist zone so long as the data converter has sufficient analog bandwidth and it is protected with an anti-aliasing filter, if necessary to prevent signals in other Nyquist zones from aliasing into the Nyquist zone of interest and corrupting the input signal. The following discussion pertains to band-pass data converters.

Spurious free dynamic range (SFDR) is defined as the ratio of the root-mean-square (RMS) value of the maximum signal component at the input of a data converter to the RMS value of the largest spurious component at its output. SFDR is a very important specification for test and measurement instruments that use T/Hs and ADCs to digitize analog signals such as spectrum analyzers, oscilloscopes, and network analyzers, as well as for test and measurement instruments that use DACs to generate analog signals such as vector signal generators and arbitrary waveform generators.

Data converters can impair SFDR by introducing various types of spurious tones. First, data converters can introduce residual tones that are related to system clocks, data patterns, or other signals used in the system. Second, two or more data converters may be interleaved to provide the equivalent of a single data converter having a higher effective sample rate (Fs'), however interleaved data converters also produce undesired spectral components referred to as "interleave images" due to mismatches between the individual data converters. Third, data converters can introduce harmonic and intermodulation distortion products.

There are many techniques to reduce these spurious tones to acceptable levels. In some applications these techniques are acceptable, however in others they are prohibitively expensive or resource intensive.

What is desired is a data converter having reduced spurious tones.

SUMMARY OF THE INVENTION

Accordingly, embodiments of the present invention provide a data converter system that confines an input signal to a specified frequency band and over-samples so that the converted input signal "straddles" or "avoids" spurious tones. The spurious tones may then be filtered away, providing an output signal having a much cleaner SFDR than a conventional data converter. For example, in one embodiment, an interleaved data converter system converts an input signal that is confined to the second Nyquist zone of one of the interleaved data converters into an interleaved signal, and then filters the interleaved signal with a filter having a pass-band that transmits the converted input frequencies and a stop-band that attenuates the spurious tones. The resulting output signal has a bandwidth that is the same as could be achieved using a single data converter, but is not impaired by interleave images or certain distortion products.

The objects, advantages and other novel features of the present invention are apparent from the following detailed description when read in conjunction with the appended claims and attached drawing.

DETAILED DESCRIPTION OF THE INVENTION

Figure 1:
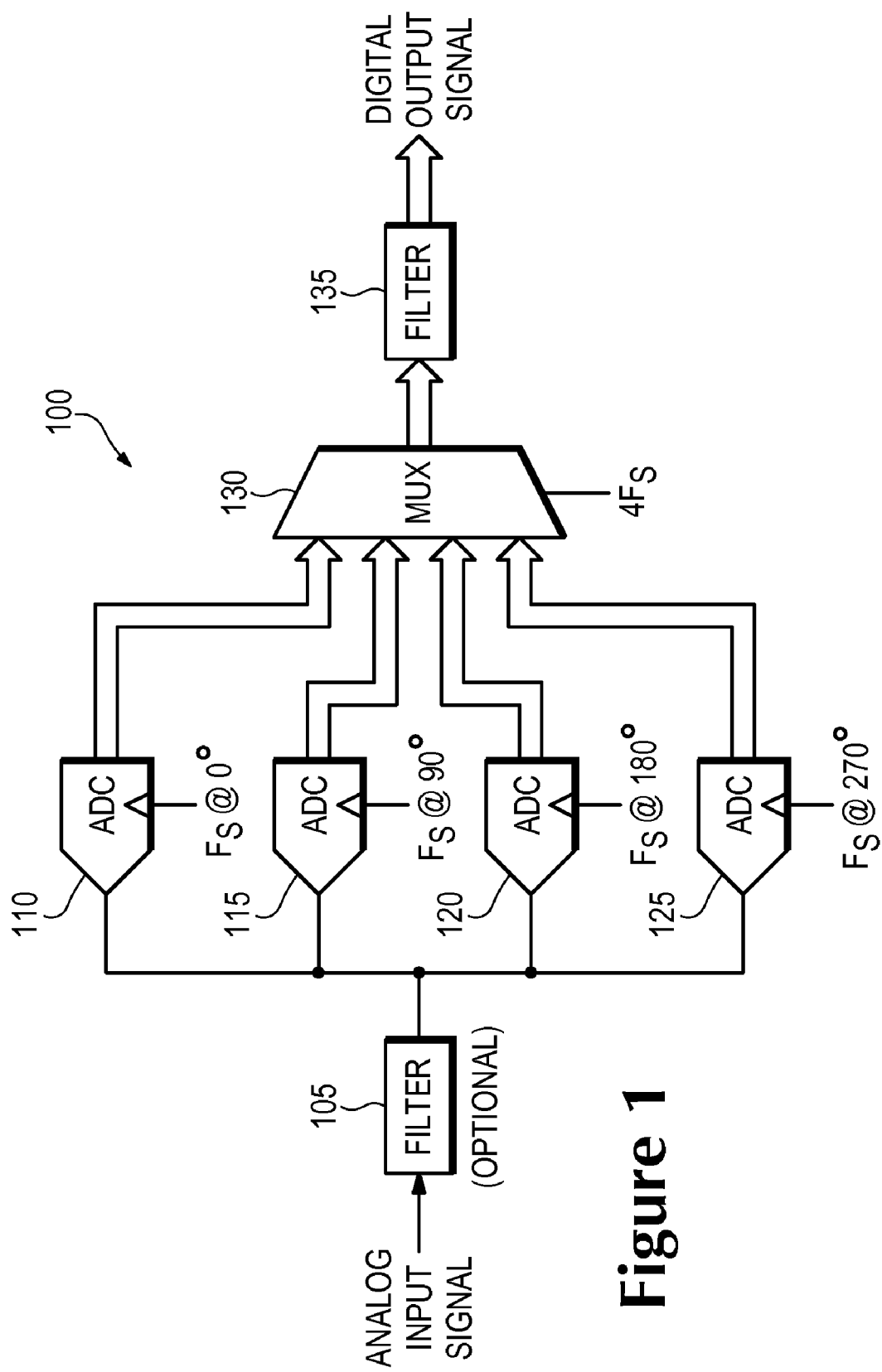
FIG. 1 depicts a high-level block diagram of a four-way interleaved analog-to-digital converter system according to an embodiment of the present invention.

As was mentioned above, two or more data converters may be interleaved to provide the equivalent of a single data converter having a higher effective sample rate, however interleaved data converters also produce interleave images due to mismatches between the individual data converters. Now, in more detail, DC offset error in a single data converter results in an error term located at DC. In an interleaved system, DC offset mismatch between the interleaved data converters results in interleave images that are located at the base sample rate of a single data converter and multiples of that frequency.

Accordingly, in one embodiment of the present invention, an interleaved data converter system avoids interleave images due to DC offset mismatch by confining an input signal so that it does not fall at DC, the base sample rate of one of the data converters used in the interleaved system, or multiples of that frequency, so that the converted input frequencies "straddle" or "avoid" the spurious tones. The spurious tones may then be filtered away, providing an output signal having a much cleaner SFDR than a conventional data converter.

Input gain and phase mismatch and sample clock timing mismatch between interleaved data converters create tones located in other Nyquist zones. If the data converters are perfectly matched, then these tones are of equal amplitude but out of phase with respect to each other and thus cancel completely. However, if the matching is not perfect, then the tones will not cancel completely, leaving residual interleave images.

Accordingly, in another embodiment of the present invention, an interleaved data converter system avoids interleave images due to input gain and phase mismatch and sample clock timing mismatch by confining an input signal to a Nyquist zone of a single data converter used in the interleaved system, so that the converted input frequencies "straddle" or "avoid" the spurious tones. The spurious tones may then be filtered away, providing an output signal having a much cleaner SFDR than a conventional data converter.

Harmonic distortion products are located at multiples of the input frequency. For example, the second and third harmonic products of a 10 MHz signal fall at 20 MHz and 30 MHz respectively. In order to determine how a data converter may avoid harmonic distortion products, consider the following: If an input signal is confined to the first Nyquist zone of a data converter, then the second harmonic distortion product will generally fall within that same band. For example, suppose that a data converter samples at 100 Mega-Samples per second (MSa/s) so that the first Nyquist zone is the frequency range spanning DC to 50 MHz. If that data converter samples a 10 MHz input signal, then the second harmonic distortion product will fall at 20 MHz, which is still in the first Nyquist zone. However, if the input signal is confined to the second Nyquist zone, then the second harmonic distortion product will fall in the third Nyquist zone. For example, if that same data converter samples a 60 MHz input signal, then the second harmonic distortion product will fall at 120 MHz which is the third Nyquist zone. Thus, it is advantageous for the data converter to operate in the second Nyquist zone only. Mathematically, this can be expressed by the requirement that the frequencies at the low end of the band containing the input signal ("Fl") must be greater than or equal to one half of the frequencies at the high end of that band ("Fh"):

$$Fl > Fh/2 \qquad \text{(Equation 1)}$$

A second requirement is that the second harmonic distortion products must not alias right back into the band containing the input signal. Aliasing occurs for the range Fs-Fh to Fs-Fl. To keep second harmonic distortion out of this band requires that:

$$2 \times Fh \leq Fs - Fh \qquad \text{(Equation 2)}$$

Adding Fh to both sides of Equation 2 and then dividing both sides by three yields:

$$Fh \leq Fs/3 \qquad \text{(Equation 3)}$$

Plugging Equation 3 into Equation 1 yields:

$$Fl > (Fs/3)/2 > Fs/6 \qquad \text{(Equation 4)}$$

Thus, in another embodiment of the present invention, a data converter may avoid second harmonic distortion products by confining the input signal to frequencies between Fs/6 and Fs/3, a frequency band having a width of Fs/6 or 16.66% of Fs. The data converter may be a single data converter or a plurality of interleaved data converters (in which case Fs becomes Fs', the effective sample rate of the interleaved system). If the data converter is a three-way interleaved data converter system, then this frequency band is equivalent to the second Nyquist zone of one of the interleaved data converters, and thus the three-way interleaved data converter system also avoids interleave images as discussed above.

This principle is not limited to avoiding second harmonic distortion products, but may be used to avoid harmonic distortion products of any degree. For example, in order to determine how a data converter may avoid third harmonic distortion products, one may re-write Equation 2 by replacing the "2" with "3" as follows:

$$3 \times Fh \leq Fs - Fh \qquad \text{(Equation 5)}$$

Solving Equations 5 and 1 as described above, one finds that a data converter may avoid third harmonic distortion products by confining the input signal to frequencies between Fs/8 and Fs/4, a frequency band having a width of Fs/8 or 12.5% of Fs. The data converter may be a single data converter or a plurality of interleaved data converters (in which case Fs becomes Fs', the effective sample rate of the interleaved system). If the data converter is a four-way interleaved data converter system, then this frequency band is equivalent to the second Nyquist zone of one of the interleaved data converters, and thus the four-way interleaved data converter system also avoids interleave images as discussed above.

Generalizing the above results, a data converter may avoid harmonic distortion products of degree n, where n is an integer greater than or equal to two, by confining an input signal to a frequency band spanning $Fs/(2\times(n+1))$ to $Fs/(n+1)$ and then attenuating the remaining Nyquist zones to eliminate the spurious tones. The higher the degree of interleaving and over-sampling that is used, the higher the degree of the harmonic distortion that may be avoided, with the trade-off being that less of the available bandwidth is used. The data converter may be a single data converter or a plurality of interleaved data converters (in which case Fs becomes Fs', the effective sample rate of the interleaved system). If the data converter is an (n+1)-way interleaved data converter system, the frequency band spanning $Fs'/(2\times(n+1))$ to $Fs'/(n+1)$ is equivalent to the second Nyquist zone of one of the interleaved data converters, and thus the interleaved data converter system also avoids interleave images as discussed above.

In accordance with the principles discussed above, FIG. 1 illustrates a four-way interleaved data converter system 100 according to an embodiment of the present invention. The four-way interleaved data converter system 100 receives an analog input signal that is confined to a specified frequency band. If necessary to prevent aliasing, an optional anti-aliasing filter 105 filters the analog input signal to produce a filtered analog signal. Four interleaved ADCs 110, 115, 120, and 125 convert the filtered analog signal into four converted signals. The four interleaved ADCs are clocked by four phases (nominally 0°, 90°, 180°, and 270°) of a sample clock so that each ADC samples at a base sample rate of Fs, where Fs is any sampling frequency that is supported by the ADC. A multiplexer 130 combines the four converted signals to form an interleaved digital signal having an effective sample rate of 4Fs or Fs'. In some embodiments, the multiplexer 130 may be implemented as a hardware multiplexer or serializer. In other embodiments, the four converted signals may be stored in memories and then multiplexed using software. A digital filter 135 having a pass-band that is substantially equivalent to the specified frequency band filters the interleaved digital signal to produce a digital output signal having reduced distortion products and interleave images. In various embodiments, the digital filter 135 may be implemented as a hardware filter (that is, using a digital signal processor, a field programmable gate array, or the like) or a software filter.

Figure 2:
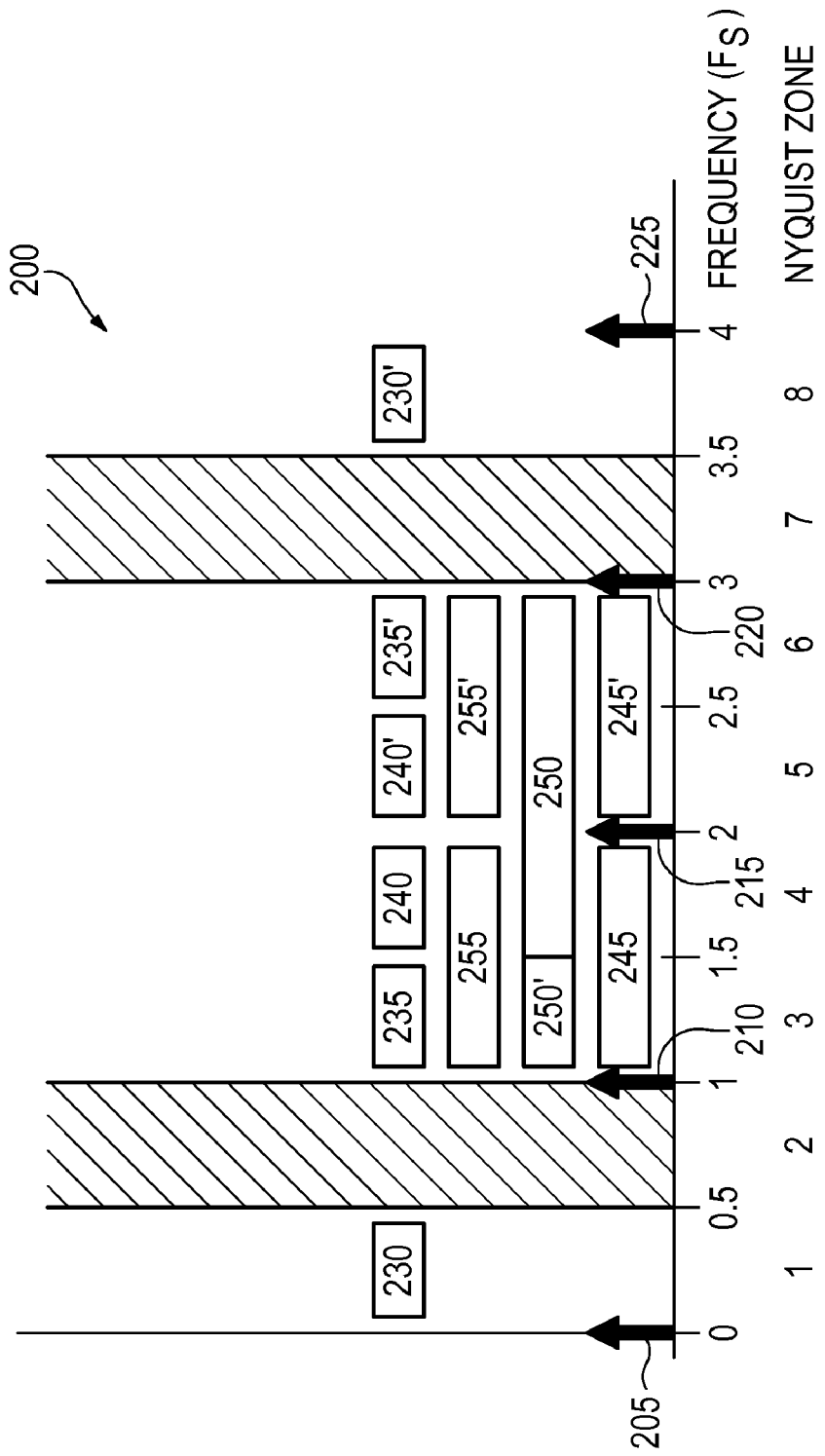
FIG. 2 illustrates the locations of interleave images and distortion products in a frequency spectrum of an interleaved digital signal produced using the four-way interleaved analog-to-digital converter system of FIG. 1.

In operation, if the specified frequency band is the second Nyquist zone of one of the four interleaved ADCs, that is, Fs/2 to Fs, then the interleave images and distortion products produced by the four interleaved ADCs will appear in the spectrum of the interleaved digital signal at the locations shown in FIG. 2. Since the four-way interleaved data converter system 100 samples at an effective sample rate of 4Fs or Fs', the interleave images and distortion products are aliased and mirror imaged about the effective Nyquist frequency of 2Fs or Fs'/2. Furthermore, the entire band between DC and 4Fs also repeats every 4Fs above 4Fs and below DC. For simplicity, these images are not shown or discussed. The Nyquist zones for each of the four interleaved ADCs are indicated on the horizontal axis. Since each of the four interleaved ADCs samples at a base sample rate of Fs, the first Nyquist zone is the frequency range spanning DC to Fs/2, the second Nyquist zone is the frequency range spanning Fs/2 to Fs, and so on.

DC offset error in one or more of the four interleaved ADCs results in an error term 205 located at DC. DC offset mismatch between the four interleaved ADCs results in interleave images 210, 215, 220, and 225 that are located at the base sample rate of a single ADC (Fs) and multiples of that frequency (2Fs, 3Fs, and 4Fs), but they do not fall in the second Nyquist zone or its image in the seventh Nyquist zone.

Input gain and phase mismatch and sample clock timing mismatch between the four interleaved ADCs result in interleave images 230, 235, and 240 that fall in first, third, and fourth Nyquist zones and interleave images 230', 235', and 240' that alias into the eighth, sixth, and fifth Nyquist zones, but again, they do not fall in the second or seventh Nyquist zones. These interleave images move as the input frequency moves, and thus they are depicted as bands that illustrate their possible locations.

Second harmonic distortion products 245 fall in the third and fourth Nyquist zones and alias 245' into the fifth and sixth Nyquist zones, but do not fall in the second or seventh Nyquist zones. Third harmonic distortion products 250 fall in the fourth, fifth, and sixth Nyquist zones and alias 250' into the third, fourth, and fifth Nyquist zones, but do not fall in the second or seventh Nyquist zones. As discussed above, the only harmonic distortion products that do fall in the second or seventh Nyquist zones are the fourth-order and higher products (not shown).

When two-tone signals Fin1 and Fin2 are applied, the primary intermodulation distortion products 255 produced are 2×Fin1, 2×Fin2, and Fin1+Fin2, which fall in the third and fourth Nyquist zones and alias 255' into the fifth and sixth Nyquist zones, but again, do not fall into the second or seventh Nyquist zones. The only intermodulation distortion products that do fall in the second or seventh Nyquist zones are the close-in products located at 2×Fin1−Fin2 and 2×Fin2−Fin1 (not shown).

In summary, because the four-way interleaved data converter system 100 confines the analog input signal to the second Nyquist zone of a single data converter and oversamples by a factor of four, the converted input signal falls in the second Nyquist zone of a single data converter and its images while the spurious tones fall in the first, third, and fourth Nyquist zones and their images. In other words, the converted input signal "straddles" or "avoids" the spurious tones. The spurious tones may then be filtered away, providing an output signal having a much cleaner SFDR than conventional data converter systems.

Since the purpose of the digital filter 135 is to transmit the specified frequency band and to attenuate the remaining Nyquist zones, it will be appreciated that the digital filter 135 is preferably a so-called "brick-wall" filter, that is, a filter that provides full transmission in a pass band, complete attenuation in a stop band, and infinitely abrupt transitions between the two. However, brick-wall filters are physically unrealizable in many applications. Thus, in other embodiments the digital filter 135 may be any type of filter that substantially transmits the specified frequency band and substantially attenuates the remaining Nyquist zones. In some embodiments, the digital filter 135 may be implemented as a band-pass filter having a pass-band that is substantially equivalent to the specified frequency band. In other embodiments, the converted input frequencies may be translated from the specified frequency band to other frequency locations before they are filtered, in which case the pass-band of the digital filter 135 must also be translated accordingly. For example, the converted input frequencies may be down-converted from the second Nyquist zone to base-band using a mixer, oscillator, and filter (not shown), in which case the digital filter 135 may be implemented as a low-pass filter.

Although the embodiments of the present invention described above confine the analog input signal to the second Nyquist zone of a single data converter, it will be recognized that the analog input signal may also be confined to any other Nyquist zone which is an image of the second Nyquist zone such as the seventh, tenth, or fifteenth Nyquist zones, provided that the interleaved data converters have sufficient analog bandwidth in that Nyquist zone and they are protected with an anti-aliasing filter, if necessary.

Figure 3:
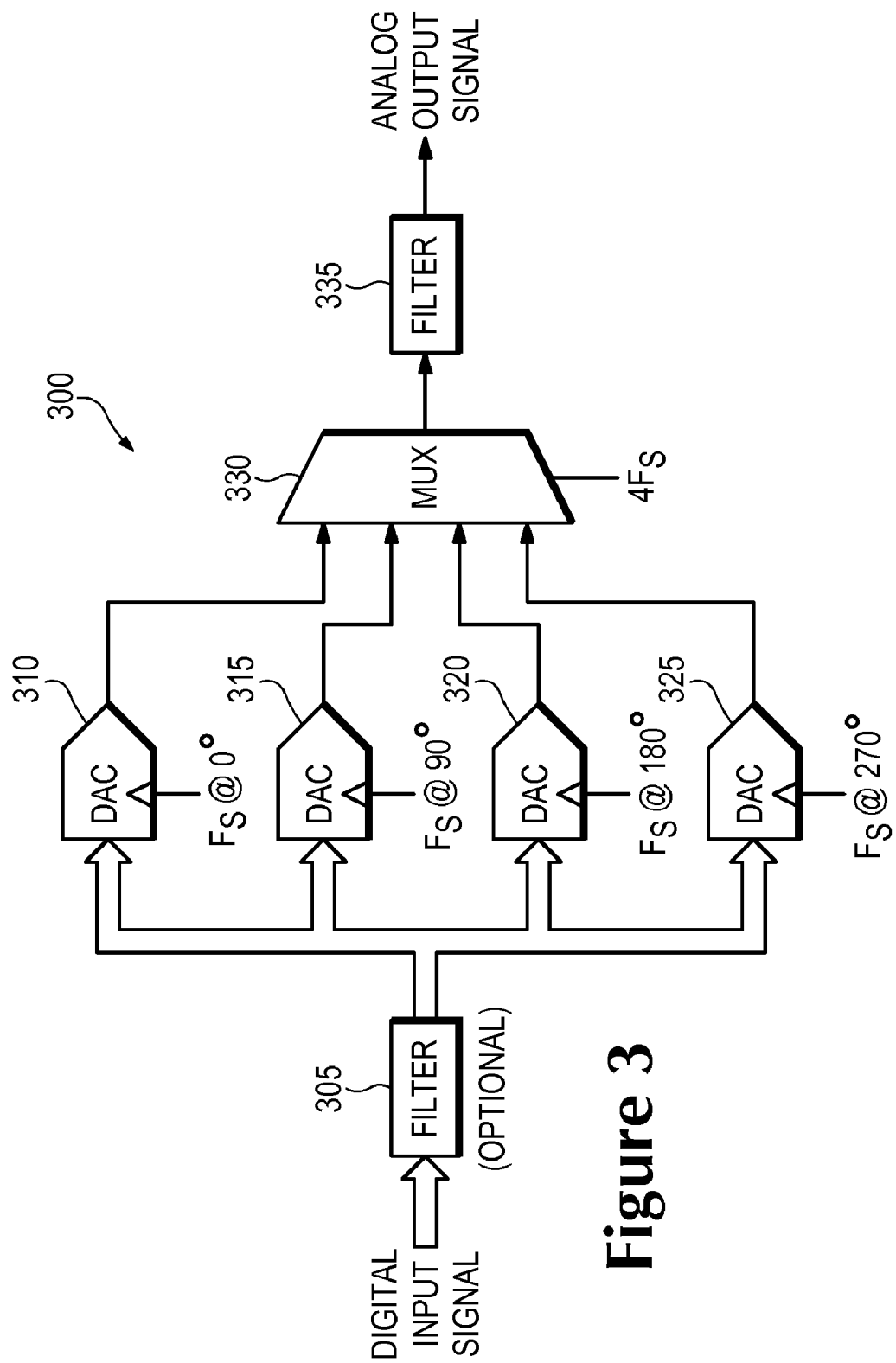
FIG. 3 depicts a high-level block diagram of a four-way interleaved digital-to-analog converter system according to an embodiment of the present invention.

Although the embodiments of the present invention described above use ADCs, it will be appreciated that the principles described herein are equally applicable to systems that use other kinds of data converters. For example, as shown in FIG. 3, a four-way interleaved data converter system 300 according to an embodiment of the present invention receives a digital input signal that is confined to a specified frequency band. If necessary to prevent aliasing, an optional anti-aliasing filter 305 filters the digital input signal to produce a filtered digital signal. Four interleaved DACs 310, 315, 320, and 325 convert the filtered digital signal into four converted signals. The four interleaved DACs are clocked by four phases (nominally 0°, 90°, 180°, and 270°) of a sample clock so that each DAC samples at a base sample rate of Fs, where Fs is any sampling frequency that is supported by the DAC. A multiplexer 330 combines the four converted signals to form an interleaved analog signal having an effective sample rate of 4Fs or Fs'. In various embodiments, the multiplexer 330 may be implemented as an analog multiplexer, a matched broadband power combiner, or any other circuit suitable for combining analog signals. An analog filter 335 referred to as "reconstruction filter" having a pass-band that is substantially equivalent to the specified frequency band filters the interleaved analog signal to produce an analog output signal. If the specified frequency band is the second Nyquist zone of one of the four interleaved DACs, that is, Fs/2 to Fs, then the analog output signal will have reduced distortion products and interleave images.

Figure 4:
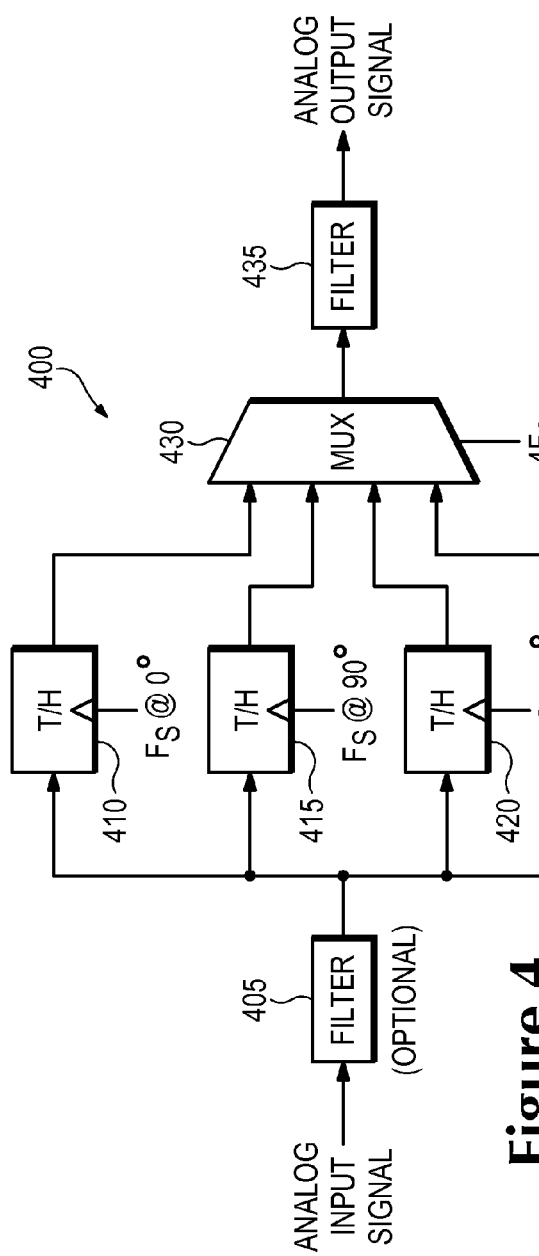
FIG. 4 depicts a high-level block diagram of a four-way interleaved track-and-hold system according to an embodiment of the present invention.

In another example shown in FIG. 4, a four-way interleaved data converter system 400 according to an embodiment of the present invention receives an analog input signal that is confined to a specified frequency band. If necessary to prevent aliasing, an optional anti-aliasing filter 405 filters the analog input signal to produce a filtered analog signal. Four interleaved T/Hs 410, 415, 420, and 425 convert the filtered analog signal into four converted signals. In various embodiments, each of the four interleaved T/Hs may be a zero-order-hold T/H, a return-to-zero (RZ) T/H, a non-return-to-zero (NRZ) T/H, a higher-order function T/H, a sampler, or the like. The four interleaved T/Hs are clocked by four phases (nominally 0°, 90°, 180°, and 270°) of a sample clock so that each T/H samples at a base sample rate of Fs, where Fs is any sampling frequency that is supported by the T/H. A multiplexer 430 combines the four converted signals to form an interleaved analog signal having an effective sample rate of 4Fs or Fs'. In various embodiments, the multiplexer 430 may be implemented as an analog multiplexer, a matched broadband power combiner, or any other circuit suitable for combining analog signals. An analog filter 435 having a pass-band that is substantially equivalent to the specified frequency band filters the interleaved analog signal to produce an analog output signal. If the specified frequency band is the second Nyquist zone of one of the four interleaved T/Hs, that is, Fs/2 to Fs, then the analog output signal will have reduced distortion products and interleave images.

Figure 5:
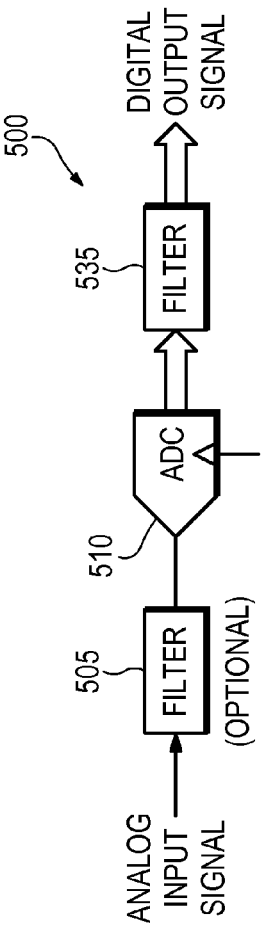
FIG. 5 depicts a high-level block diagram of a non-interleaved analog-to-digital converter system according to an embodiment of the present invention.

Although the embodiments of the present invention illustrated in FIGS. 1, 3, and 4 avoid both interleave images and distortion products, it will be appreciated that other embodiments may avoid only interleave images, or only distortion products, by using different specified frequency bands. Furthermore, although the embodiments of the present invention illustrated in FIGS. 1, 3, and 4 use interleaved data converters, it will be appreciated that some of the embodiments that avoid only distortion products may use a single data converter. As an example of both of these variations, FIG. 5 shows a non-interleaved analog-to-digital converter system 500 according to an embodiment of the present invention that avoids harmonic distortion products of degree n, where n is an integer greater than or equal to two, by confining an analog input signal to a specified frequency band spanning Fs/(2×(n+1)) to Fs/(n+1). If necessary to prevent aliasing, an optional anti-aliasing filter 505 filters the analog input signal to produce a filtered analog signal. A single ADC 510 sampling at a sample rate Fs, where Fs is any sampling frequency that is supported by the ADC, converts the filtered analog signal into a converted signal. A digital filter 535 having a pass-band that is substantially equivalent to the specified frequency band filters the converted signal to produce a digital output signal having reduced distortion products.

It will be appreciated from the foregoing discussion that the present invention represents a significant advance in the field of data converters. Although specific embodiments of the invention have been illustrated and described for purposes of illustration, it will be understood that various modifications may be made without departing from the spirit and scope of the invention. Accordingly, the invention should not be limited except as by the appended claims.

What is claimed is:

1. A data converter system that avoids spurious tones comprising:
   a data converter for converting an input signal into a converted signal, the input signal being confined to a specified frequency band; and
   a filter for filtering the converted signal to produce an output signal, the filter having a pass-band that transmits converted input frequencies and a stop-band that attenuates the spurious tones; wherein:
   the spurious tones comprise harmonic distortion products of degree n, where n is an integer greater than or equal to two;
   the data converter is a single non-interleaved data converter;
   the specified frequency band comprises a frequency band spanning Fs/(2×(n+1)) to Fs/(n+1), where Fs is the sample rate of the single non-interleaved data converter.

2. A data converter system that avoids spurious tones comprising:
   a data converter for converting an input signal into a converted signal, the input signal being confined to a specified frequency band; and
   a filter for filtering the converted signal to produce an output signal, the filter having a pass-band that transmits converted input frequencies and a stop-band that attenuates the spurious tones; wherein:
   the spurious tones comprise harmonic distortion products of degree n, where n is an integer greater than or equal to two;
   the data converter comprises a plurality of interleaved data converters for converting the input signal into a plurality of interleaved signals, and means for combining the plurality of interleaved signals into the converted signal; and
   the specified frequency band comprises a frequency band spanning Fs'/(2×(n+1)) to Fs'/(n+1), where Fs' is the effective sample rate of the plurality of interleaved data converters, and the specified frequency band is not a Nyquist zone of one of the interleaved data converters.

3. A data converter system as in any one of claim 1 or 2 wherein:
   each of the data converters comprises an analog-to-digital converter;
   the input signal is an analog signal;
   the converted signal and output signal are digital signals; and
   the filter comprises a digital filter.

4. A data converter system as in any one of claim 1 or 2 wherein:
   each of the data converters comprises an digital-to-analog converter;
   the input signal is a digital signal;
   the converted signal and output signal are analog signals; and
   the filter comprises an analog filter.

5. A data converter system as in any one of claim 1 or 2 wherein:
   each of the data converters comprises a track-and-hold;
   the input signal is an analog signal;
   the converted signal and output signal are analog signals; and
   the filter comprises an analog filter.

* * * * *